(12) United States Patent
Lo et al.

(10) Patent No.: US 6,818,516 B1
(45) Date of Patent: Nov. 16, 2004

(54) SELECTIVE HIGH K DIELECTRICS REMOVAL

(75) Inventors: Wai Lo, Lake Oswego, OR (US); Hong Lin, Vancouver, WA (US); Shiqun Gu, Vancouver, WA (US); James R. B. Elmer, Vancouver, WA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/629,496

(22) Filed: Jul. 29, 2003

(51) Int. Cl.[7] .............................................. H01L 21/336
(52) U.S. Cl. ....................................... 438/287; 438/307
(58) Field of Search ................................. 438/216, 287, 438/305, 306, 307, 591

(56) References Cited

U.S. PATENT DOCUMENTS 6,063,698 A * 5/2000 Tseng et al. ................. 438/585
6,303,418 B1 * 10/2001 Cha et al. .................... 438/591
6,455,330 B1 * 9/2002 Yao et al. .................... 438/287
6,656,852 B2 * 12/2003 Rotondaro et al. .......... 438/287

* cited by examiner

*Primary Examiner*—Chandra Chaudhari
(74) *Attorney, Agent, or Firm*—Luedeka, Neely & Graham

(57) ABSTRACT

A method of forming a gate structure in an integrated circuit on a substrate. A high k layer is formed on the substrate, and a gate electrode layer is formed on the high k layer. The gate electrode layer is the patterned. LDD regions are formed using an ion implantation process, thereby creating damaged portions of the high k layer. A first portion of the damaged portions of the high k layer are removed, thereby defining a gate structure, and leaving remaining portions of the damaged portions of the high k layer. Sidewall spacers are formed adjacent the gate structure. Source/drain regions are formed using an ion implantation process, thereby further damaging the remaining portions of the damaged portions of the high k layer. The remaining portions of the damaged portions of the high k layer are then removed.

20 Claims, 2 Drawing Sheets

SELECTIVE HIGH K DIELECTRICS REMOVAL

FIELD

This invention relates to the field of integrated circuit fabrication. More particularly, this invention relates to forming integrated circuits with advanced dielectric materials.

BACKGROUND

Silicon dioxide has typically been used as the dielectric material between the electrically conductive gate electrode, often formed of polysilicon, and the semiconducting channel of a transistor, which is typically formed of silicon. Silicon dioxide has provided adequately high capacitance for gate insulation in the past, with devices having gate geometries of about 130 nanometers and greater. However, with the ever increasing demands of scaled-down device geometries and more densely populated integrated circuits, silicon oxide tends to no longer be good enough for the gate insulation layer.

Current transistor geometries use a gate insulation layer of silicon dioxide that is about twelve to sixteen angstroms thick, or the thickness of about six to ten individual silicon atoms. The silicon dioxide layer gates the electrons through the channel, controlling the flow of electricity across the transistor. However, when the transistor is reduced in size, the silicon dioxide gate insulation layer is also proportionally thinned. As gate lengths decrease from one hundred and thirty nanometers to ninety, sixty-five, and even thirty nanometers, the thickness of the silicon oxide gate will be reduced to less than ten angstroms, or to about three monolayers.

Unfortunately, once the gate insulation layer is reduced to less than about twenty angstroms, the silicon dioxide is no longer able to provide effective insulation from the effects of quantum tunneling currents, and the transistor tends to exhibit relatively high leakage.

Thus, the integrated circuit fabrication industry is searching for gate insulator materials with a low equivalent oxide thickness that mimics the electrical properties of very thin silicon dioxide, while providing a thicker physical layer over the channel to prevent quantum-mechanical tunneling. New materials in the form of oxides of heavy and rare earth metals, with higher dielectric constants and higher capacitances have been investigated with some promising results, including HfSiON, $ZrO_2$, $HfO_2$, HfON, $La_2O3$, $CeO_2$, $Na_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, $Lu_2O_3$.

However, these so called high k materials have other problems associated with their use. For example, they do not easily form volatile compounds and are relatively difficult to remove by either dry etching or wet etching. Dry etching has been attempted with ion milling or bombardment and sputtering with the use of argon or other inert ions. However, the process is time consuming and can cause extensive damage to the surrounding structures, such as the polysilicon gate electrode. The necessarily extended use of plasma as an etch tends to increase the plasma damage to the substrate itself, as well as to other structures.

There is a need, therefore, for a method whereby such high k materials can be patterned and etched without unduly damaging the surrounding structures that are formed in a conventional CMOS process flow.

SUMMARY

The above and other needs are met by a method of forming a gate structure in an integrated circuit on a substrate. A high k layer is formed on the substrate, and a gate electrode layer is formed on the high k layer. The gate electrode layer is the patterned. LDD regions are formed using an ion implantation process, thereby creating damaged portions of the high k layer. A first portion of the damaged portions of the high k layer are removed, thereby defining a gate structure, and leaving remaining portions of the damaged portions of the high k layer. Sidewall spacers are formed adjacent the gate structure. Source/drain regions are formed using an ion implantation process, thereby further damaging the remaining portions of the damaged portions of the high k layer. The remaining portions of the damaged portions of the high k layer are then removed.

In this manner, two different ion implantation processes are used to damage the high k layer, which enables it to be more readily and completely removed. However, special ion implantation processes are not required. Rather, the standard LDD and source/drain implantation processes are used, and the high k layer is thus removed by an etch following each of these two processes. Studies indicate that only as much as about three percent of the high-k layer remains after these two ion implantation processes and etch processes, which is an insufficient amount to substantially and detrimentally effect the integrated circuit.

Because the damaged high k material etches at a much faster rate than does the undamaged high k material, this process advantageously makes use of an etch that can proceed at an acceptably high etch rate. The higher the degree of crystallinity in the undamaged portions of the high k layer, the greater the etch differential between undamaged portions of the high k layer, such as in the gate structure, and the damaged portions of the high k layer. Thus, the etch of the high k layer is extremely anisotropic, tending only to appreciably remove those portions of the high k layer that have been damaged, and not undercutting the high k gate insulation layer within the gate structure to any appreciable extent.

In various preferred embodiments, the high k layer is at least one of HfSiON, $ZrO_2$, HfON, $La_2O_3$, $CeO_2$, $Na_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, $Lu_2O_3$, and most preferably hafnium dioxide. The LDD implanted species is preferably arsenic. Preferably, the LDD ion implantation is conducted at a dopant level of about $6(10)^{13}$ atoms per square centimeter and at an energy of about eighty thousand electron volts. The first portion of the damaged portions of the high k layer is preferably removed using a solution of hydrofluoric acid. Preferably, the source/drain implanted species comprises arsenic. The source/drain ion implantation is preferably conducted at a dopant level of about $3(10)^{15}$ atoms per square centimeter and at an energy of about forty thousand electron volts. Preferably, the remaining portions of the damaged portions of the high k layer are removed using a solution of hydrofluoric acid. There is preferably an additional step of forming a base interface layer on the substrate prior to the step of forming the high k layer. The high k layer is preferably formed using at least one of a metallorganic chemical vapor deposition process, an atomic layer deposition process, and a physical vapor deposition process. The gate electrode layer is preferably formed of at least one of polycrystalline silicon and polycrystalline germanium.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
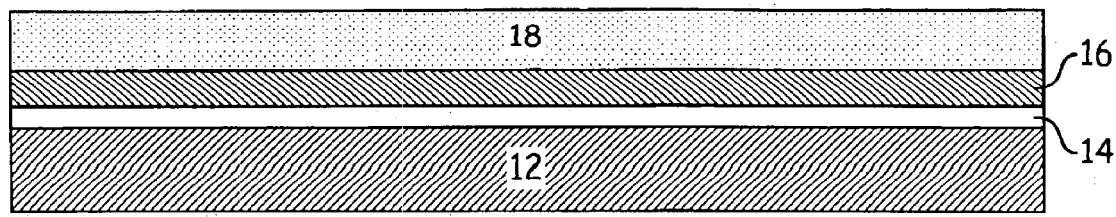
FIG. 1 is a cross sectional representation of an integrated circuit with a base interface layer, high k layer, and gate electrode layer formed on a substrate.

With reference now to FIG. 1, there is depicted a cross sectional representation of a portion of an integrated circuit 10 with an optional base interface layer 14, a high k layer 16, and a gate electrode layer 18 formed on a base substrate 12. It is appreciated that the sizes as depicted in the figures are not to scale, so that elements that are very small in comparison to other elements can be seen without undue complication of the figures. It is further appreciated that designation of "substrate" as used herein refers to either or both of the base substrate 12, or all of the layers—including the base substrate 12—on top of which another layer is formed.

In the preferred embodiment the base interface layer 14 is a layer of silicon dioxide having a thickness of between about zero angstroms and about twenty angstroms, or a silicon oxynitride layer. However, the base interface layer 14 is an optional layer, and is not present in some of the embodiments of the invention. The high k layer 16 is preferably formed with a thickness of between about fifteen angstroms and about two hundred angstroms, and is preferably formed of an oxide of a heavy or rare earth metal, including at least one of the materials such as HfSiON, $ZrO_2$, $HfO_2$, HfON, $La_2O_3$, $CeO_2$, $Na_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, $Lu_2O_3$. Most preferably, the high k layer 16 is formed of hafnium dioxide. The dielectric constant of the high k layer 16 is preferably greater than that of silicon dioxide, and most preferably between about twelve and about thirty.

The high k layer 16 is preferably initially formed as an amorphous layer, although depending upon the process used, it may also be initially formed as a crystalline layer. However, regardless of how it is initially formed, the high k layer 16 tends to take on a relatively high degree of crystalline structure upon the first high temperature heat treatment that it receives. Upon become crystalline, the high k layer 16 become extremely difficult to etch using standard processing. Thus, while the methods described herein are applicable to both amorphous and crystalline high k layers 16, they are especially of value when the high k layer 16 has a high degree of crystal structure prior to etching.

Figure 2:
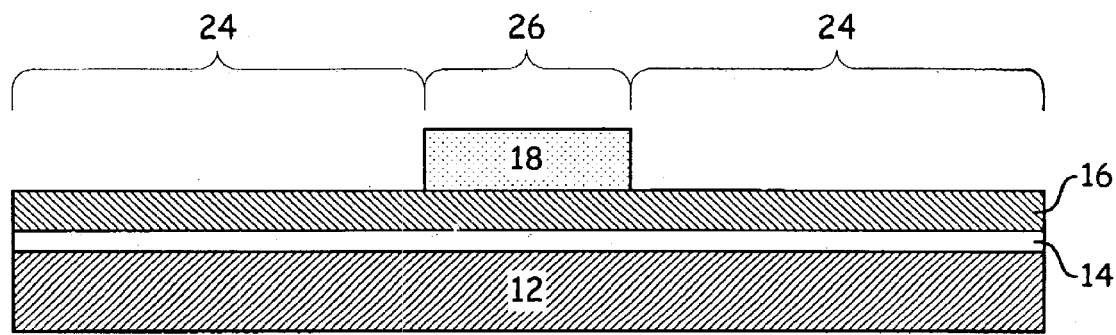
FIG. 2 is a cross sectional representation of an integrated circuit with a base interface layer, high k layer, and a patterned gate electrode layer.

The gate electrode layer 18 is preferably formed of polycrystalline silicon, but may also be formed of polycrystalline germanium. As used herein, the term polycrystalline is, meant to include the meaning of the term amorphous, even though there may be technical differences between the two terms. As seen in FIG. 2, the gate electrode layer 18 is patterned and etched to form the beginning of a gate structure. The etch process does not etch the high k layer 16 because the high k layer 16 tends to be extremely resistive to etching, as described above. Therefore, the high k layer 16 tends to provide an excellent etch stop to the etching process used to define the gate electrode layer 18. The patterned gate electrode layer 18 also defines a high k gate insulation layer region 26, which underlies the gate electrode layer 18, and exposed portions 24 of the high k layer 16.

Figure 3:
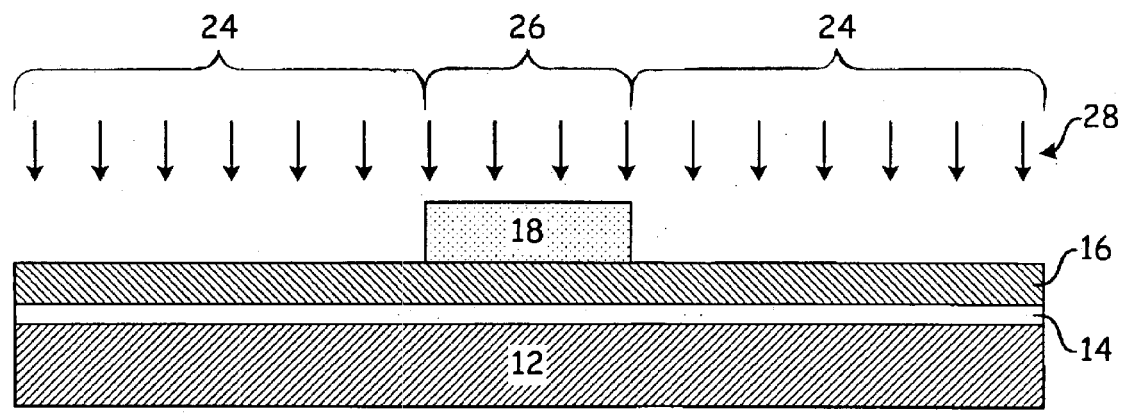
FIG. 3 is a cross sectional representation of an integrated circuit with a base interface layer, high k layer, and patterned gate electrode layer receiving a standard LDD ion implanted species.

The exposed portions 24 of the high k layer 16 are subjected to a standard LDD (low dosage drain) ion implantation of a species 28, as depicted in FIG. 3. The standard LDD implant causes lattice damage to the exposed portions 24 of the high k layer 16. However, the gate electrode layer 18 is preferably sufficiently resistant to the LDD ion implantation so as to prohibit the implanted species from penetrating the gate electrode layer 18 with sufficient energy to damage the high k layer 16 in the region 26. In a preferred embodiment, the implanted species 28 is either a p or n type dopant, such as arsenic. Preferably the ion implantation is conducted at a dopant level of about $6(10)^{13}$ atoms per square centimeter and with an energy of about eighty thousand electron volts.

Figure 4:
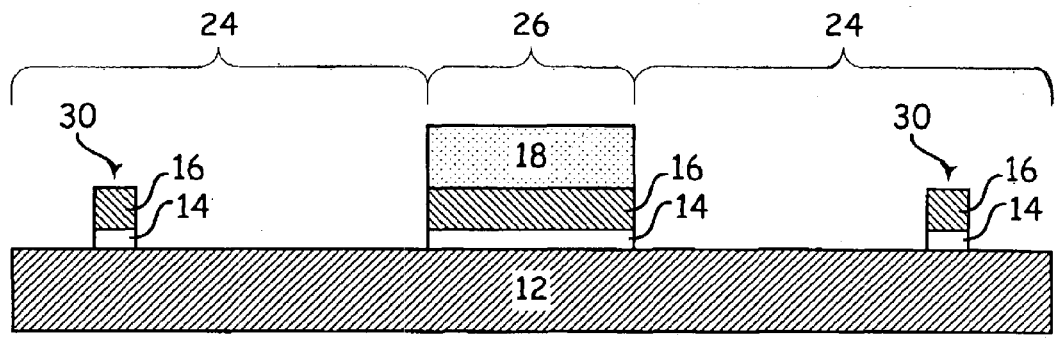
FIG. 4 is a cross sectional representation of an integrated circuit with a patterned base interface layer, high k layer, and gate electrode layer, and incompletely removed base interface layer and high k layer artifacts.

Once the lattice damage has been caused to the exposed portions 24 of the high k layer 16, most of the exposed portions 24 of the high k layer 16 can be etched relatively easily, as compared to those portions 26 of the high k layer 16 that have not sustained lattice damage. However, some remaining portions 30 are left behind, as depicted in FIG. 4. Most preferably the etching process is a wet etch using a solution of hydrofluoric acid. As the hydrofluoric acid is relatively selective as to the underlying base substrate 12, which is most preferably silicon, first portions of the exposed portion 24 of the high k layer 16 and underlying portions of the base interface layer 14 are removed during the etch process, but the underlying base substrate 12 is not damaged to any appreciable degree by the etch process.

Because the protected and undamaged portion 26 of the high k layer 16 does not etch at an appreciable rate, or at least etches at a rate that is dramatically less than the rate at which the lattice damaged portion 24 of the high k layer 16 etches, the etching process, even though preferably accomplished as a wet etch, is substantially anisotropic at the edges of the gate structure. In other words, the etching process does not undercut the high k layer 16 in the protected regions 26 to any substantial degree, because the etch rate of the high k layer 16 in the protected regions 26 is so low.

Figure 5:
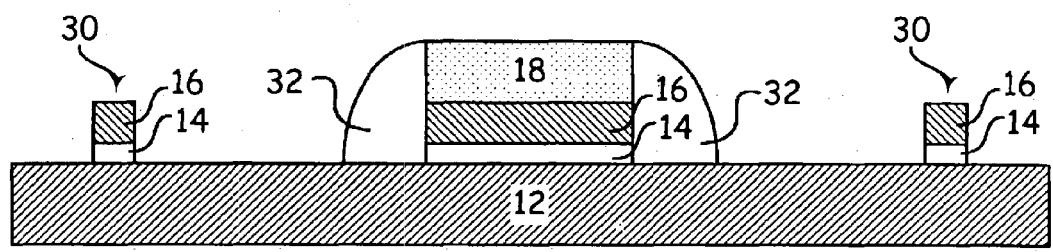
FIG. 5 is a cross sectional representation of an integrated circuit with a base interface layer, high k layer, and gate electrode layer with adjacent gate electrode sidewall spacers.
Figure 6:
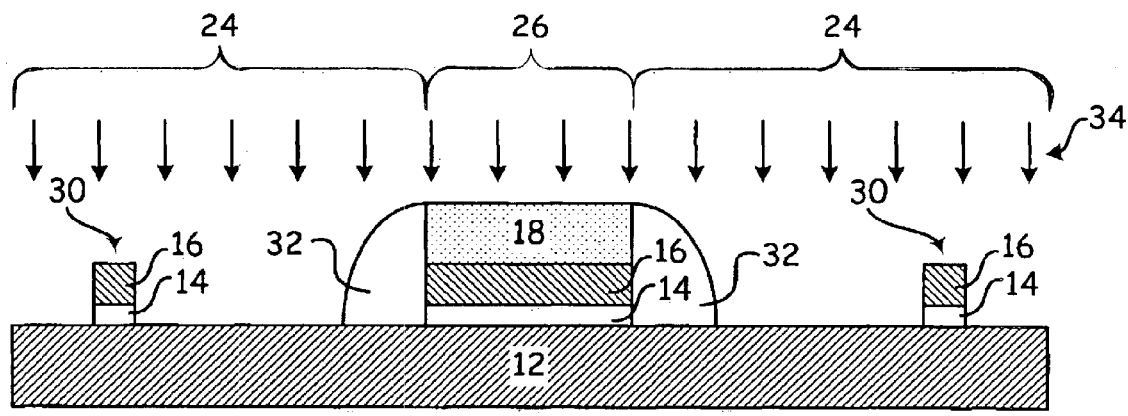
FIG. 6 is a cross sectional representation of an integrated circuit with a base interface layer, high k layer, gate electrode layer, and sidewall spacers receiving a standard source/drain ion implanted species.

Sidewall spacers 32 are next deposited, patterned, and formed, as depicted in FIG. 5. Following the formation of the sidewall spacers 32, a standard source/drain ion implantation process is performed of a species 34, as depicted in FIG. 6. The implanted species 34 is preferably the standard species that is used to create the source/drain regions in the base substrate 12, and the process is preferably a standard source/drain implant process. Preferably, the source/drain implant is arsenic, when an n type implant is desired, with a dose of about $3(10)^{15}$ atoms per square centimeter and an energy of about forty thousand electron volts.

Figure 7:
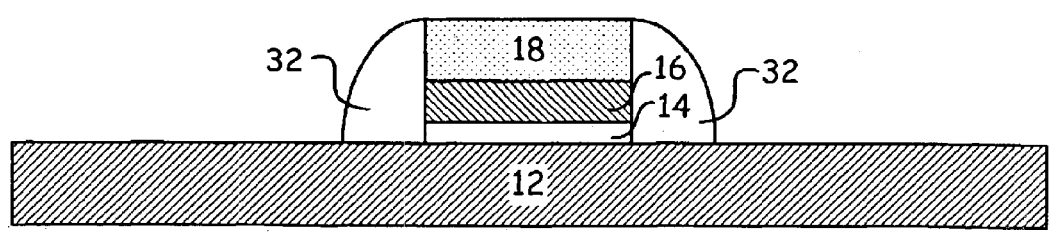
FIG. 7 is a cross sectional representation of an integrated circuit with a patterned base interface layer, high k layer, and gate electrode layer, where the base interface layer and high k layer artifacts have been removed.

The source/drain implantation further damages the remaining portions 30 of the high k layer 16, which can then be removed with the underlying remaining portions of the base interface layer 14, such as with an HF wet etch as described above. The resultant structure is depicted in FIG. 7. Thus, in the embodiments according to the present invention, standard implantation processes, such as the LDD and the source/drain implants, are used to damage the high k layer 16, which enables removal of the high k layer 16 such as by wet etching. Thus, no additional process steps are required for etching the high k layer 16. At the end of processing as described above, standard CMOS processing is accomplished to complete the integrated circuit 10.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of forming a gate structure in an integrated circuit on a substrate, the method comprising the steps of:

forming a high k layer on the substrate, forming a gate electrode layer on the high k layer, patterning the gate electrode layer, forming LDD regions using an ion implantation process, thereby creating damaged portions of the high k layer, removing a first portion of the damaged portions of the high k layer, thereby defining a gate structure, and leaving remaining portions of the damaged portions of the high k layer, forming sidewall spacers adjacent the gate structure, forming source/drain regions using an ion implantation process, thereby further damaging the remaining portions of the damaged portions of the high k layer, and removing the remaining portions of the damaged portions of the high k layer.

2. The method of claim 1, wherein the high k layer comprises hafnium dioxide.

3. The method of claim 1, wherein the high k layer comprises at least one of HfSiON, $ZrO_2$, HFON, $La_2O_3$, $CeO_2$, $Na_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, $Lu_2O_3$.

4. The method of claim 1, wherein the LDD implanted species comprises arsenic.

5. The method of claim 1, wherein the LDD ion implantation is conducted at a dopant level of about $6(10)^{13}$ atoms per square centimeter.

6. The method of claim 1, wherein the LDD ion implantation is conducted at an energy of about eighty thousand electron volts.

7. The method of claim 1, wherein the first portion of the damaged portions of the high k layer is removed using a solution of hydrofluoric acid.

8. The method of claim 1, wherein the source/drain implanted species comprises arsenic.

9. The method of claim 1, wherein the source/drain ion implantation is conducted at a dopant level of about $3(1)^{15}$ atoms per square centimeter.

10. The method of claim 1, wherein the source/drain ion implantation is conducted at an energy of about forty thousand electron volts.

11. The method of claim 1, wherein the remaining portions of the damaged portions of the high k layer are removed using a solution of hydrofluoric acid.

12. The method of claim 1, further comprising the step of forming a base interface layer on the substrate prior to the step of forming the high k layer.

13. The method of claim 1, wherein the high k layer is formed using at least one of a metallorganic chemical vapor deposition process, an atomic layer deposition process, and a physical vapor deposition process.

14. The method of claim 1, wherein the gate electrode layer is formed of at least one of polycrystalline silicon and polycrystalline germanium.

15. A method of forming a gate structure in an integrated circuit on a substrate, the method comprising the steps of:

forming a base interface layer on the substrate, forming a high k layer on the base interface layer, forming a gate electrode layer of polycrystalline silicon on the high k layer, patterning the gate electrode layer, forming LDD regions using an ion implantation process, thereby creating damaged portions of the high k layer, removing a first portion of the damaged portions of the high k layer, thereby defining a gate structure, and leaving remaining portions of the damaged portions of the high k layer, forming sidewall spacers adjacent the gate structure, forming source/drain regions using an ion implantation process, thereby further damaging the remaining portions of the damaged portions of the high k layer, and removing the remaining portions of the damaged portions of the high k layer.

16. The method of claim 15, wherein the high k layer comprises hafnium dioxide.

17. The method of claim 15, wherein the high k layer comprises at least one of HfSiON, $ZrO_2$, HfON, $La_2O_3$, $CeO_2$, $Na_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, $Lu_2O_3$.

18. A method of forming a gate structure in an integrated circuit on a substrate, the method comprising the steps of:

forming a base interface layer on the substrate, forming a high k layer on the base interface layer, forming a gate electrode layer on the high k layer, patterning the gate electrode layer, forming LDD regions using an ion implantation process, thereby creating damaged portions of the high k layer, removing a first portion of the damaged portions of the high k layer, thereby defining a gate structure, and leaving remaining portions of the damaged portions of the high k layer, removing a first portion of the base interface layer underlying the first portion of the damaged portions of the high k layer, and leaving remaining portions of the base interface layer underlying the remaining portions of the damaged portions of the high k layer, forming sidewall spacers adjacent the gate structure, forming source/drain regions using an ion implantation process, thereby further damaging the remaining portions of the damaged portions of the high k layer, removing the remaining portions of the damaged portions of the high k layer, and removing the remaining portions of the base interface layer.

19. The method of claim 18, wherein the high k layer comprises hafnium dioxide.

20. the method of claim 18, wherein the high k layer comprises at least one of HfSiON, $ZrO_2$, HfON, $La_2O_3$, $CeO_2$, $Na_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, $Lu_2O_3$.

* * * * *